(12) United States Patent
Webb

(10) Patent No.: US 6,171,877 B1
(45) Date of Patent: Jan. 9, 2001

(54) OPTICAL TRANSMITTER PACKAGE ASSEMBLY AND METHODS OF MANUFACTURE

(75) Inventor: Brian A. Webb, Chandler, AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/099,022

(22) Filed: Jun. 17, 1998

Related U.S. Application Data

(62) Division of application No. 08/671,864, filed on Jun. 28, 1996, now Pat. No. 5,808,325.

(51) Int. Cl.[7] .......................... H01L 21/00; H01L 21/44; H01L 21/50
(52) U.S. Cl. ................. 438/25; 438/27; 438/106; 438/127
(58) Field of Search ................. 438/22, 25, 27, 438/29, 55, 64, 106, 123, 127, 26; 257/79, 98, 99, 680; 385/88

(56) References Cited

U.S. PATENT DOCUMENTS

| | | | |
|---|---|---|---|
| 3,805,347 | 4/1974 | Collins et al. | 29/25.13 |
| 4,768,070 | 8/1988 | Takizawa et al. | 357/17 |
| 4,877,756 * | 10/1989 | Yamamoto et al. | 438/25 |
| 5,175,783 * | 12/1992 | Tatoh | 385/93 |
| 5,309,460 * | 5/1994 | Fujimaki et al. | 372/36 |
| 5,384,471 | 1/1995 | Schairer et al. | 257/98 |
| 5,434,939 | 7/1995 | Matsuda | 385/88 |
| 5,614,735 | 3/1997 | Kitamura et al. | 257/99 |
| 5,692,084 * | 11/1997 | Roff | 385/88 |

FOREIGN PATENT DOCUMENTS

| 1137655 | 5/1989 | (JP) | 257/100 |
|---|---|---|---|

* cited by examiner

*Primary Examiner*—Charles Bowers
*Assistant Examiner*—Brook Kebede
(74) *Attorney, Agent, or Firm*—A. Kate Huffman; Daniel R. Collopy

(57) ABSTRACT

A package assembly (31) has a leadframe (10) including a locating flange (30), an optical transmitter (22) such as a laser diode mounted to the leadframe, and a package (32) enclosing both the optical transmitter and a portion of the leadframe so that the locating flange of the leadframe is disposed outside of the package. The locating flange is used as a reference datum to align the optical transmitter's relative height and lateral position during manufacture. Also, the locating flange is used as a reference datum in mating the package assembly to other, standard optical components when mounting to other components in an optical end product.

5 Claims, 2 Drawing Sheets

OPTICAL TRANSMITTER PACKAGE ASSEMBLY AND METHODS OF MANUFACTURE

The present application is a divisional of U.S. application Ser. No. 08/671,864 filed on Jun. 28, 1996 now U.S. Pat. No. 5,808,325, which is hereby incorporated by reference, and priority thereto for common subject matter is hereby claimed.

BACKGROUND OF THE INVENTION

The present invention relates, in general, to optical devices and, more particularly, to package assemblies for optical transmitters.

Laser diodes are used in a wide range of electronic applications including compact disk players and drives, bar code readers, and other similar identification and data storage technologies. These laser diodes are typically side-emitting lasers that are mounted in special metal cans having a clear lens in the top of the can. There are several industry standard metal cans for these applications, for example the well-known TO-18, 46, and 56 metal cans.

Because side-emitting lasers generate significant heat and degrade if overheated, it is necessary to use metal cans like the above to provide sufficient heat dissipation during operation. Typically, the metal can is mounted to a header, a laser die is mounted on a post that rises vertically above the header, and a lens is mounted separately on top of the metal can. The resulting package is often not hermetic.

The above metal can packages suffer from several disadvantages including high manufacturing costs due to the need for a special mounting header and metal can. Further, side-emitting lasers cannot be tested prior to singulation from a semiconductor wafer. Therefore, manufacturing yields are depressed. Moreover, with this prior metal can package, critical optical alignment of the laser diode and the package is required at the time of manufacturing an optical end product, at which time the metal can package must be mated to another optical component, such as an optical tube containing lenses. Alignment at this point in manufacture is critical because tolerances are as small as 10 microns. As a result of this critical alignment and tight tolerance, yield losses are significant. Accordingly, there is a need for an improved laser diode package assembly that has reduced manufacturing cost, improved yields, and that does not require critical alignment at a late point in the manufacture of an optical application end product.

DETAILED DESCRIPTION OF THE DRAWINGS

Figure 1:
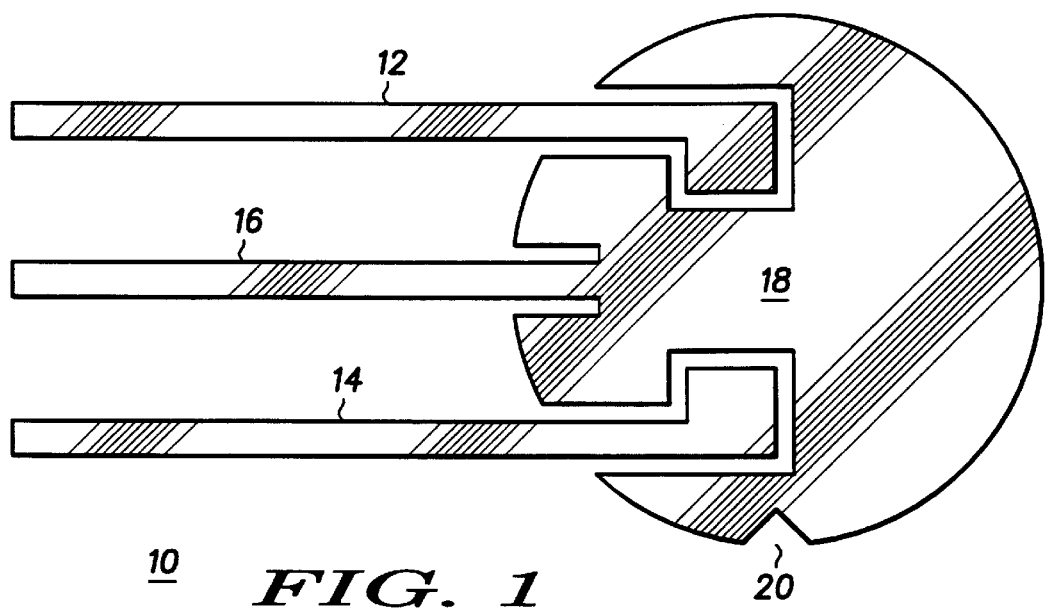
FIG. 1 is a top view of a leadframe used in the package assembly of FIG. 3.

FIG. 1 illustrates a top view of a leadframe 10 that is used in the manufacture of a package assembly according to the present invention. Leadframe 10 has signal leads 12 and 14 and a ground lead 16 that is integral with a flag 18. As discussed below, flag 18 is later used for mounting a semiconductor laser die or other similar optical components. Leadframe 10 also optionally has a key 20, which is useful for mating the final package assembly (as shown in later figures) to another component in an applicable optical end product.

Figure 2:
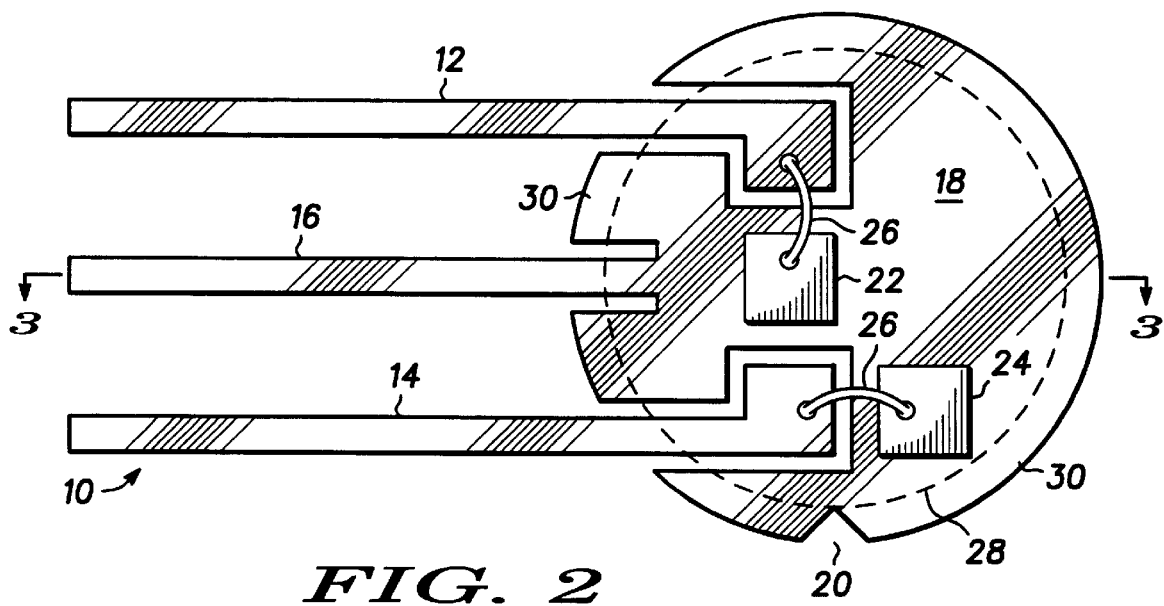
FIG. 2 is a top schematic view illustrating the relative lateral positions of optical elements in the package assembly of FIG. 3.

FIG. 2 is a top schematic view of leadframe 10 and some components mounted thereon. An optical transmitter 22, such as a laser diode and preferably a vertical cavity surface emitting laser, is mounted on flag 18 using, for example, a conductive epoxy. An optical receiver 24 is similarly mounted on flag 18 and optionally used to provide feedback control of the optical output from optical transmitter 22. Also, transmitter 22 and receiver 24 are, for example, electrically connected to leads 12 and 14 by wire bonds 26 and may further similarly share electrical connections to flag 18 and ground lead 16.

Package boundary 28, which is illustrated in FIG. 2 as a dashed line, indicates the location of the package that is later formed to encapsulate transmitter 22 and receiver 24. It should be noted that according to the present invention, package boundary 28 defines a locating flange 30 that extends around the periphery of flag 18 and outside of package boundary 28. As will be discussed later, locating flange 30 is used as an alignment and reference datum during manufacture so that critical alignment is not required at later stages when doing final assembly on an end product (as is necessary with prior metal can packages). It should also be noted that key 20 is disposed on the perimeter of locating flange 30.

Figure 3:
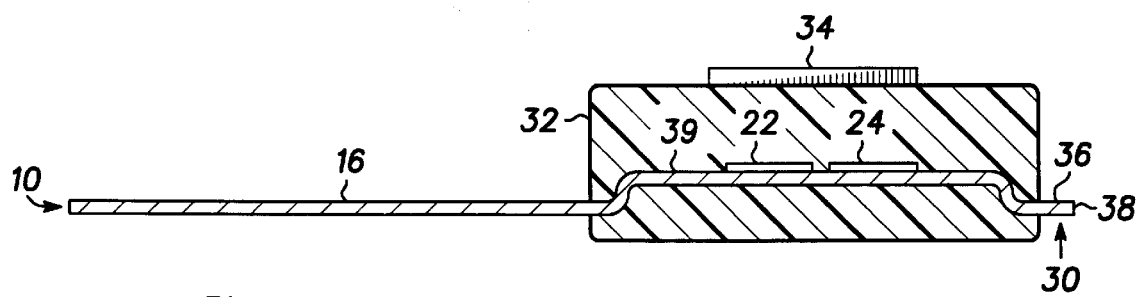
FIG. 3 is a simplified cross-sectional view of a package assembly according to the present invention.

FIG. 3 is a simplified cross-sectional view of a package assembly 31 formed using leadframe 10 and the components shown in FIG. 2. After mounting the components as discussed above with respect to FIG. 2, package 32 is formed to enclose transmitter 22 and receiver 24. It should be noted that the perimeter of package 32 corresponds to package boundary 28 of FIG. 2. As shown in FIG. 3, an elevated platform 39 has been formed, for example, by conventional leadframe stamping as needed to adjust the height of transmitter 22 above and relative to locating flange 30. However, it should be noted that in some applications, it is not necessary to use such an elevated platform. For example, transmitter 22 and receiver 24 need not be elevated for use in optical end product applications in which the ability to interchange package assembly 31 with prior standard metal can packages is not desired or necessary.

Package 32 is, for example, formed from a transparent or clear plastic molding compound. When using such a plastic package, it is advantageous and preferred that transmitter 22 be a vertical cavity surface-emitting laser as this type of laser operates using significantly lower power and does not require the special heat sinking necessary for side-emitting lasers in prior metal can packages.

An optical element 34, for example, a hologram or a lens (such as a fresnel, culminating, or collimating lens), is mounted to package 32. The hologram can be provided by a holographic film formed by conventional techniques on, for example, a polyimide material and adhered to a glass plate, which is then mounted on top of package 32 using a clear adhesive. Alternatively, if mechanical protection is not required, the holographic film may be formed to adhere directly to package 32. In the case where optical element 34 is a lens, the lens can be molded directly into the top of plastic package 32.

When a plastic package like the above is used, a reflective or opaque coating can optionally be deposited on the surface of plastic package 32 to avoid performance degradation by ambient light. Also, an advantage of plastic packaging in contrast to prior metal can packages is that superior hermetic reliability can be achieved.

Although the specific embodiment presented above has been described as having a molded plastic package, one of skill in the art will recognize that other types of packages, including the use of different materials and/or shapes, can also be used with the present invention. For example, a pre-molded plastic package may also be used. When using such other packages, one of skill in the art will appreciate that locating flange 30 can still used as a reference datum as described herein for alignment during the manufacture of package assembly 31 itself and during its assembly with an end product.

As shown in FIG. 3, locating flange 30 has a surface 36 and an edge 38. As mentioned above, locating flange 30 is advantageously used as an alignment and reference datum during the manufacture of package assembly 31. Specifically, the height (i.e., the position in a direction substantially perpendicular to leadframe 10) of transmitter 22 above locating flange 30 of leadframe 10 is determined using locating flange 30 as a reference. For example, surface 36 can be used as such a reference during manufacture, and precision die attach and leadframe stamping technologies can be used to position transmitter 22 above locating flange 30 within a tolerance of, for example, about 0.5 microns.

Also, the lateral position (i.e., the position in a direction substantially parallel to leadframe 10) of transmitter 22 is similarly established during assembly relative to, for example, edge 38 and key 20 of locating flange 30. Moreover, optical element 34 is optically coupled and aligned to transmitter 22, and this alignment is preferably established using locating flange 30 as a reference datum.

Accordingly, by mounting optical element 34 and transmitter 22 by the use of locating flange 30 as a reference datum, critical alignment of these components is accomplished in an earlier stage of manufacture than with prior metal can packages. After manufacture, package assembly 31 need only be mounted to another standard optical component using locating flange 30 as a mating reference. Such use of flange 30 will result in the establishment of good optical alignment between package assembly 31 and its transmitter 22 and optical element 34 and the optics of the other end product optical components being mated to package assembly 31.

Figure 4:
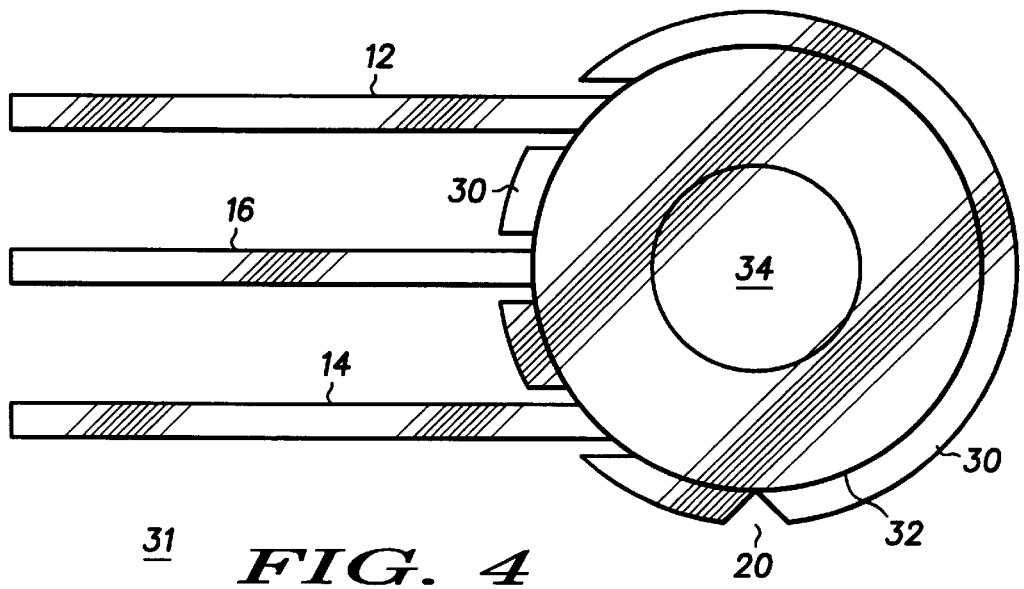
FIG. 4 is a top view of the package assembly of FIG. 3.

FIG. 4 is a top view of package assembly 31. As shown in FIG. 4, leads 12, 14, and 16 extend outward from package 32 and are substantially parallel. An advantage of this lead configuration is that it can be used in an interdigitated leadframe design which dramatically reduces the leadframe area required for a given number of packages. However, other leadframe configurations can be used in which, for example, the leads are spaced uniformly around the circumference of package 32.

Figure 5:
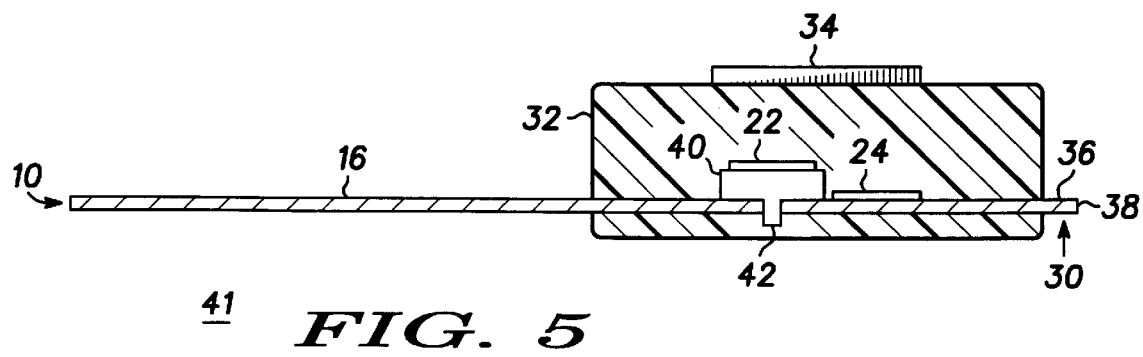
FIG. 5 is a simplified cross-sectional view of a package assembly according to an alternate embodiment.

FIG. 5 is a simplified cross-sectional view of package assembly 41 according to another embodiment of the present invention. Common reference numerals are used for common elements. In this particular embodiment, a pedestal 40 is mounted to leadframe 10 using a stake 42 by conventional staking techniques. Pedestal 40 is used instead of elevated platform 39 (see FIG. 3) to adjust the height of transmitter 22 above leadframe 10.

Package assembly 31 according to the present invention can be readily designed to be compatible with the industry standard TO-18, 46, or 56 metal can packages now used for laser diodes. However, as discussed above, package assembly 31 accomplishes optical alignment in a novel way using locating flange 30 during mating to other optical components in an optical end product. This leads to reduced manufacturing cost. Also, when a vertical cavity surface emitting laser is used, testing of each laser die can be performed at the semiconductor wafer level thereby further reducing manufacturing cost. In contrast, prior metal can packages required critical optical alignment at the time of mating to these other optical components.

By now, it should be appreciated that there has been described a novel package assembly for an optical transmitter. This package assembly reduces manufacturing cost by permitting critical optical alignment relative to a locating flange during the manufacture of the package assembly. This eliminates the requirement for critical alignment when mating the package assembly to other optical components when assembling a final optical end product. Further, the use of a surface emitting laser and a plastic package permits the incorporation of optical elements such as lenses directly into the package above the laser diode.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A method of manufacturing a package assembly for a surface-emitting optical transmitter, comprising the steps of:

mounting a surface emitting optical transmitter to a leadframe;

forming a package having a top surface, the package enclosing said optical transmitter and a first portion of said leadframe to provide a locating flange formed from said leadframe and disposed outside of said package;

aligning the optical transmitter in a first direction relative to the locating flange to determine a height of the optical transmitter above the locating flange, wherein the first direction is substantially perpendicular to the leadframe; and mounting an optical element near the top surface of the package and above the optical transmitter in a manner that optically couples the optical element to the optical transmitter and aligns the optical element relative to the locating flange.

2. The method of manufacturing the package assembly of claim 1 wherein the aligning further comprises aligning of the optical transmitter in a second direction relative to said locating flange to determine a distance from an edge of said locating flange, wherein said second direction is substantially parallel to said leadframe.

3. The method of manufacturing the package assembly of claim 1 further comprising the step of mounting an optical element on said package that is optically coupled to said optical transmitter, wherein said step of mounting said optical element comprises aligning said optical element relative to at least one key disposed on a perimeter of said locating flange.

4. The method of manufacturing the package assembly of claim 1 further comprising the step of, prior to said step of mounting an optical transmitter, forming an elevated platform from a second portion within said first portion of said leadframe and wherein said step of mounting said optical transmitter includes mounting said optical transmitter on said elevated platform.

5. The method of manufacturing the package assembly of claim 1 further comprising the step of, prior to said step of mounting an optical transmitter, mounting a pedestal to said leadframe and wherein said step of mounting said optical transmitter includes mounting said optical transmitter on said pedestal.

* * * * *